United States Patent
San et al.

(10) Patent No.: US 7,119,730 B2
(45) Date of Patent: Oct. 10, 2006

(54) ANALOG-TO-DIGITAL CONVERTER FOR PROGRAMMABLE LOGIC

(75) Inventors: Tony San, Sunnyvale, CA (US); Jinyan Zhang, Santa Clara, CA (US)

(73) Assignee: Altera Corporation, San Jose, CA (US)

(*) Notice: Subject to any disclaimer, the term of this patent is extended or adjusted under 35 U.S.C. 154(b) by 0 days.

(21) Appl. No.: 11/189,436

(22) Filed: Jul. 25, 2005

(65) Prior Publication Data

US 2006/0066464 A1    Mar. 30, 2006

Related U.S. Application Data

(63) Continuation of application No. 10/351,076, filed on Jan. 24, 2003, now Pat. No. 6,956,512.

(51) Int. Cl.
*H03M 1/34* (2006.01)
*H03M 1/78* (2006.01)
*H03M 3/00* (2006.01)

(52) U.S. Cl. .......................... 341/163; 341/143; 341/154

(58) Field of Classification Search .................. 341/163, 341/118, 120, 143, 155, 159, 161, 165, 162, 341/172, 156; 327/91; 324/607; 702/107
See application file for complete search history.

(56) References Cited

U.S. PATENT DOCUMENTS

| | | | | | |
|---|---|---|---|---|---|
| 4,415,882 | A | * | 11/1983 | Akazawa et al. | 341/156 |
| 4,498,072 | A | * | 2/1985 | Moriyama | 341/118 |
| 4,598,269 | A | * | 7/1986 | Penney | 341/118 |
| 4,649,371 | A | * | 3/1987 | Kolluri | 341/159 |
| 4,651,132 | A | * | 3/1987 | Lillis et al. | 341/118 |
| 4,940,981 | A | * | 7/1990 | Naylor et al. | 341/161 |
| 5,272,481 | A | * | 12/1993 | Sauer | 341/165 |
| 5,579,005 | A | * | 11/1996 | Moroni | 341/155 |
| 5,661,483 | A | * | 8/1997 | Negahban et al. | 341/161 |
| 5,684,487 | A | * | 11/1997 | Timko | 341/172 |
| 6,198,313 | B1 | * | 3/2001 | Poucher et al. | 327/91 |
| 6,380,881 | B1 | * | 4/2002 | Harada et al. | 341/165 |
| 6,424,284 | B1 | * | 7/2002 | Lopata et al. | 341/163 |
| 6,556,164 | B1 | * | 4/2003 | Schmid | 341/163 |
| 6,608,580 | B1 | * | 8/2003 | Hsueh | 341/155 |
| 6,674,386 | B1 | * | 1/2004 | Carreau et al. | 341/155 |
| 6,747,588 | B1 | * | 6/2004 | Huang et al. | 341/156 |
| 6,828,927 | B1 | * | 12/2004 | Hurrell et al. | 341/156 |
| 6,844,840 | B1 | * | 1/2005 | Melanson | 341/161 |
| 6,894,632 | B1 | * | 5/2005 | Robinson | 341/143 |
| 6,922,164 | B1 | * | 7/2005 | Piasecki et al. | 341/163 |
| 6,956,512 | B1 | * | 10/2005 | San et al. | 341/120 |
| 6,956,518 | B1 | * | 10/2005 | Piasecki et al. | 341/166 |
| 6,958,722 | B1 | * | 10/2005 | Janakiraman et al. | 341/161 |
| 7,015,844 | B1 | * | 3/2006 | Boemler | 341/143 |

* cited by examiner

*Primary Examiner*—Patrick Wamsley
(74) *Attorney, Agent, or Firm*—Townsend and Townsend and Crew LLP

(57) ABSTRACT

Digital-to-analog and analog-to-digital conversion are implemented in or using programmable logic. The DAC and ADC circuits may be hardwired in a programmable logic integrated circuit or may be implemented using an intellectual property (IP) core. The IP core would be a series of bits to configure the logic cells and other programmable logic of an integrated circuit to include one or more DACs or ADC, or both on the same integrated circuit. The DAC may be a sigma-delta-modulator-based implementation or a resistor-ladder-based implementation.

21 Claims, 10 Drawing Sheets

ANALOG-TO-DIGITAL CONVERTER FOR
PROGRAMMABLE LOGIC

BACKGROUND OF THE INVENTION

The present invention relates to the field of programmable integrated circuits and in particular, to techniques and circuitry for implementing digital-to-analog converters (DACS) and analog-to-digital converters (ADCs) in a programmable logic.

Integrated circuits are important building blocks of the modern age. Technology continues to evolve and integrated circuits continue to provide improved functionality. As integrated circuits improve, so do the electronics systems that are built using integrated circuits. There are many types of integrated circuit such as memories, microprocessors, application specific integrated circuits (ASICs), and programmable logic. Programmable logic integrated circuits such as PALs, PLDs, FPGAs, LCAs, and others are becoming more complex and continually evolving to provide more user-programmable features on a single integrated circuit. Modern programmable logic integrated circuits incorporate programmable logic including logic gates, products terms, or look-up tables. Programmable logic integrated circuits also included embedded user-programmable memory or RAM.

Despite the success of programmable logic, there is a continuing desire to provide greater functionality in a programmable logic integrated circuit, but at the same time, provide greater performance. Desired functionalities include digital-to-analog and analog-to-digital conversion. Analog interfaces are needed especially as communications interfaces to, for example, 3G and 4G wireless, cable modems, Intelsat, and OFDM. A typical bandwidth for OFDM is 5 to 10 megahertz, cable modem is 5 megahertz, and 2.5 G–3 G–4 G is 3 to 5 megahertz. The typical desired resolutions are 6 to 10 bits. Also some multimedia applications need analog interfaces.

Therefore, there is a need to provide techniques and circuitry for implementing digital-to-analog and analog-to-digital conversion in programmable logic.

SUMMARY OF THE INVENTION

The invention provides techniques and circuitry to implement digital-to-analog and analog-to-digital conversion in programmable logic. The DAC and ADC circuits may be hardwired in a programmable logic integrated circuit or may be implemented using an IP core. The IP core would configure the logic cells and other programmable logic of an integrated circuit to include one or more DACs or ADC, or both on the same integrated circuit. The DAC may be a sigma-delta-modulator-based implementation or a resistor-ladder-based implementation.

The invention may use low voltage differential signal (LVDS) inputs, sigma-delta modulator (implemented using logic cells), a single resistor, a signal capacitor, or any combination of these, to implement a DAC or ADC, or both. By providing DAC and ADC functions in a programmable logic integrated circuit, users can incorporate a mixed signal design within the integrated circuit.

In an embodiment of the invention includes providing bits to configure a low voltage differential signal I/O cell to operate as a comparator, where the comparator is coupled to the logic cells used to implement the digital-to-analog converter.

In another embodiment, the invention is a programmable logic integrated circuit including a first DAC circuit providing a first analog output, where the first DAC is resistor-ladder based, and a second DAC circuit providing a second analog output. There is a comparator circuit including inputs connected to the first and second analog outputs of the first DAC circuit and the second DAC circuit. There is a calibration logic block connected to a comparator output of the comparator circuit. There is a memory having a memory data input connected to the calibration logic block and a memory output connected to an input of the first DAC circuit.

In another embodiment, the invention is a method of operating a programmable logic integrated circuit including configuring logic cells of the programmable logic integrated circuit to implement a first DAC and a second DAC, where the first DAC is resistor-ladder-based. The method includes using the second DAC to calibrate the first DAC.

In another embodiment, the invention is a programmable logic integrated circuit including a DAC circuit, an LVDS I/O cell connected to an analog output of the DAC circuit, and an analog input signal connected to the LVDS I/O cell. This is a successive approximation register circuit connected to an output of the LVDS I/O cell, where the successive approximation register circuit provides a digital output sample which is equivalent to the analog input.

Other objects, features, and advantages of the present invention will become apparent upon consideration of the following detailed description and the accompanying drawings, in which like reference designations represent like features throughout the figures.

DETAILED DESCRIPTION OF THE
INVENTION

Figure 1:
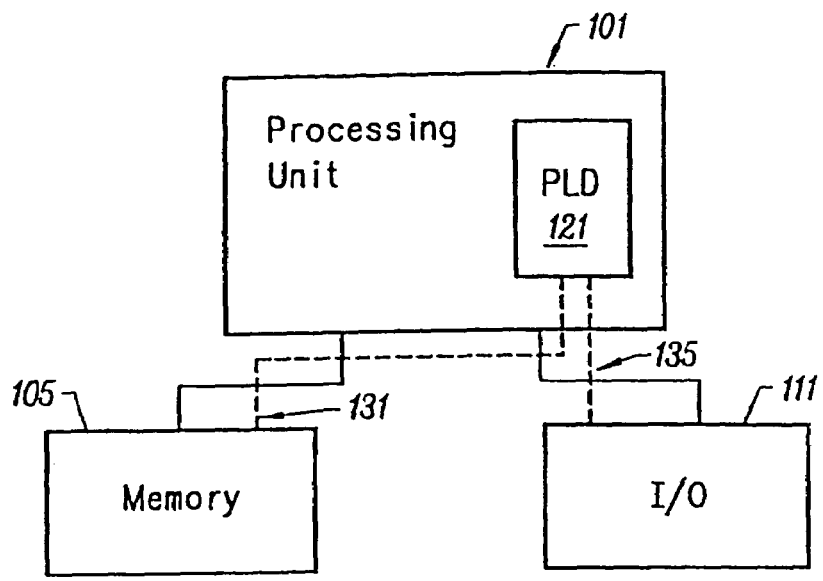
FIG. 1 is diagram of a digital system with a programmable logic integrated circuit.

FIG. 1 shows a block diagram of a digital system, within which input and output interfaces consistent with the present invention may be embodied. The system may be provided on a single board, on multiple boards, or within multiple enclosures. Though embodiments of the present invention are useful in electronic and integrated circuits in general, they are particularly useful in programmable logic devices. FIG. 1 illustrates a system 101 in which such a programmable logic device 121 may be utilized. Programmable logic devices or programmable logic integrated circuits are sometimes referred to as a PALs, PLAs, FPLAs, PLDs, CPLDs, EPLDs, EEPLDs, LCAs, or FPGAs and are well-known integrated circuits that provide the advantages of fixed integrated circuits with the flexibility of custom integrated circuits. Such devices allow a user to electrically program standard, off-the-shelf logic elements to meet a user's specific needs and are sold, e.g., by Altera Corporation of San Jose, Calif. Programmable logic integrated circuits and their operation are well known to those of skill in the art.

In the particular embodiment of FIG. 1, a processing unit 101 is coupled to a memory 105 and an I/O 111, and incorporates a programmable logic device 121. PLD 121 may be specially coupled to memory 105 through connection 131 and to I/O 111 through connection 135. The system may be a programmed digital computer system, digital signal processing system, specialized digital switching network, or other processing system. Moreover, such systems may be designed for a wide variety of applications such as, merely by way of example, telecommunications systems, automotive systems, control systems, consumer electronics, personal computers, Internet communications and networking, and others.

Processing unit 101 may direct data to an appropriate system component for processing or storage, execute a program stored in memory 105 or input using I/O 111, or other similar function. Processing unit 101 may be a central processing unit (CPU), microprocessor, floating point coprocessor, graphics coprocessor, hardware controller, microcontroller, programmable logic device programmed for use as a controller, network controller, or other processing unit. Furthermore, in many embodiments, there is often no need for a CPU. For example, instead of a CPU, one or more PLDs 121 may control the logical operations of the system. In an embodiment, PLD 121 acts as a reconfigurable processor, which can be reprogrammed as needed to handle a particular computing task. Alternately, programmable logic device 121 may include a processor. In some embodiments, processing unit 101 may even be a computer system. Memory 105 may be a random access memory (RAM), read only memory (ROM), fixed or flexible disk media, PC Card flash disk memory, tape, or any other storage retrieval means, or any combination of these storage retrieval means. PLD 121 may serve many different purposes within the system in FIG. 1. PLD 121 may be a logical building block of processing unit 101, supporting its internal and external operations. PLD 121 is programmed to implement the logical functions necessary to carry on its particular role in system operation.

Figure 2:
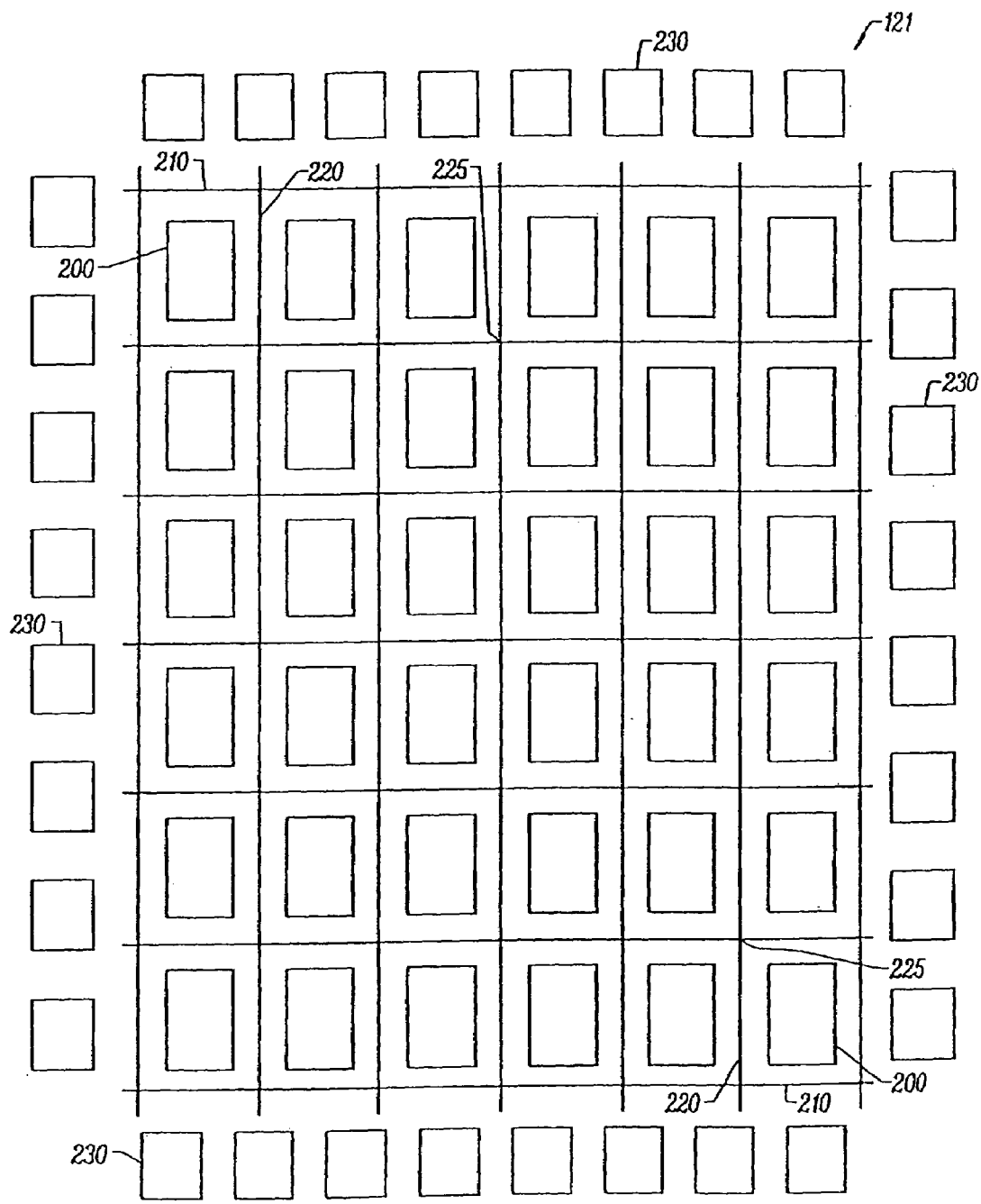
FIG. 2 is a diagram showing a floor plan of a programmable logic integrated circuit with an embedded processor.

FIG. 2 is a simplified block diagram of an overall internal architecture and organization of a PLD. Many details of programmable logic architecture, organization, and circuit design are not necessary for an understanding of the present invention and such details are not shown.

FIG. 2 shows a six-by-six two-dimensional array of thirty-six logic array blocks (LABs) 200. LAB 200 is a physically grouped set of logical resources that is configured or programmed to perform logical functions. The internal architecture of a LAB is described in more detail below. The programmable logic portion may contain any arbitrary number of LABs. Generally, in the future, as technology advances and improves, programmable logic devices with greater numbers of logic array blocks will undoubtedly be created. Furthermore, LABs 200 need not be organized in a square matrix or array; for example, the array may be organized in a five-by-seven or a twenty-by-seventy matrix of LABs.

LAB 200 has inputs and outputs (not shown), some of which may be consistent with the present invention, and which may or may not be programmably connected to a global interconnect structure, comprising an array of horizontal interconnects 210 and vertical interconnects 220. Although shown as single lines in FIG. 2, each set of interconnect lines may represent a plurality of signal conductors. The inputs and outputs of LAB 200 are programmably connectable to these sets of interconnect lines, such that multiple LABs 200 may be connected and combined to implement larger, more complex logic functions than can be realized using a single LAB 200.

In other embodiments, the programmable logic integrated circuit may include a special or segmented interconnect that is connected to a specific number of LABs and not necessarily an entire row or column of LABs. For example, the segmented interconnect may programmably connect two, three, four, five, or more LABs.

The programmable logic architecture in FIG. 2 further shows the peripheries of the chip, input and output circuits 230. Input and output circuits 230 are for interfacing the PLD to external, off-chip circuitry. Some or all of these input and output circuits 230 may be consistent with embodiments of the present invention. FIG. 2 shows thirty-two input and output circuits 230; however, a programmable logic integrated circuit may contain any number of input and output circuits, more or less than the number depicted. As discussed above, some of these input-output drivers may be shared between the embedded processor and programmable logic portions. Each input and output circuit 230 is configurable for use as an input driver, output driver, or bidirectional driver. In other embodiments of a programmable logic integrated circuit, the input and output circuits may be embedded with the integrated circuit core itself. This embedded placement of the input and output circuits may be used with flip chip packaging and will minimize the parasitics of routing the signals to input and output circuits.

Figure 3:
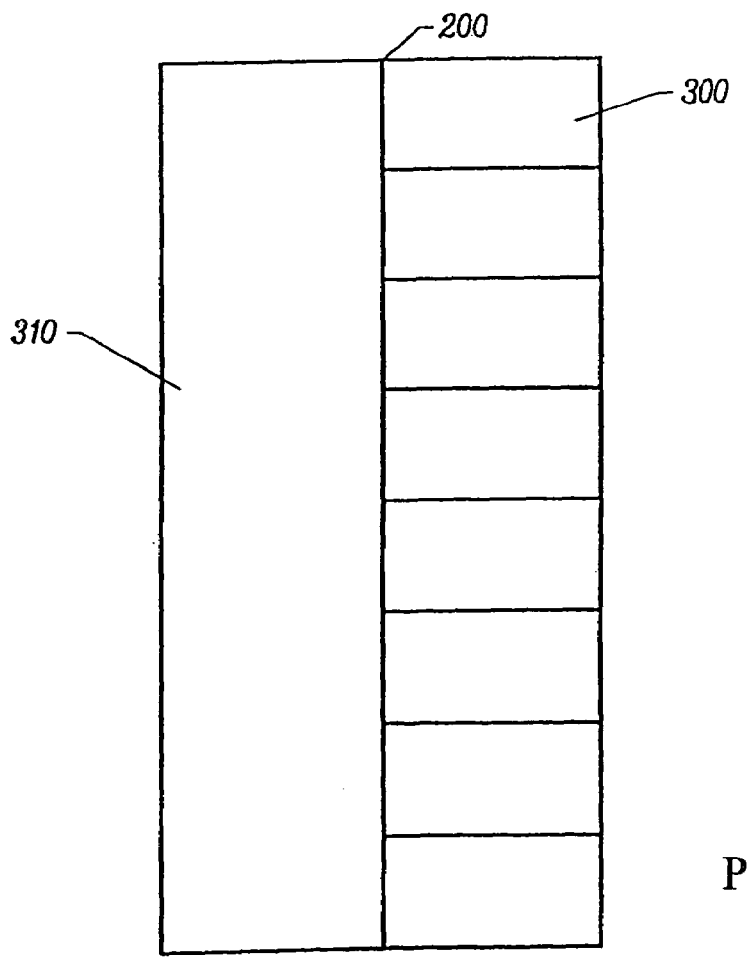
FIG. 3 is a diagram showing the programmable logic portion of the programmable logic integrated circuit.

FIG. 3 shows a simplified block diagram of LAB 200 of FIG. 2. LAB 200 is comprised of a varying number of logic elements (LEs) 300, sometimes referred to as "logic cells," and a local (or internal) interconnect structure 310. LAB 200 has eight LEs 300, but LAB 200 may have any number of LEs, more or less than eight.

A general overview of LE 300 is presented here, sufficient to provide a basic understanding of the present invention. LE 300 is the smallest logical building block of a PLD. Signals external to the LAB are connectable to LE 300 through local interconnect structure 310. In one embodiment, LE 300 of the present invention incorporates a function generator that is configurable to provide a logical function of a number of variables, such a four-variable Boolean operation. As well as combinatorial functions, LE 300 also provides support for sequential and registered functions using, for example, D flip-flops.

LE 300 provides combinatorial and registered outputs that are connectable to the interconnect lines 210 and 220, outside LAB 200. Furthermore, the outputs from LE 300 may be internally fed back into local interconnect structure 310; through local interconnect structure 310, an output from one LE 300 may be programmably connected to the inputs of other LEs 300, without using the global interconnect structure.

Figure 4:
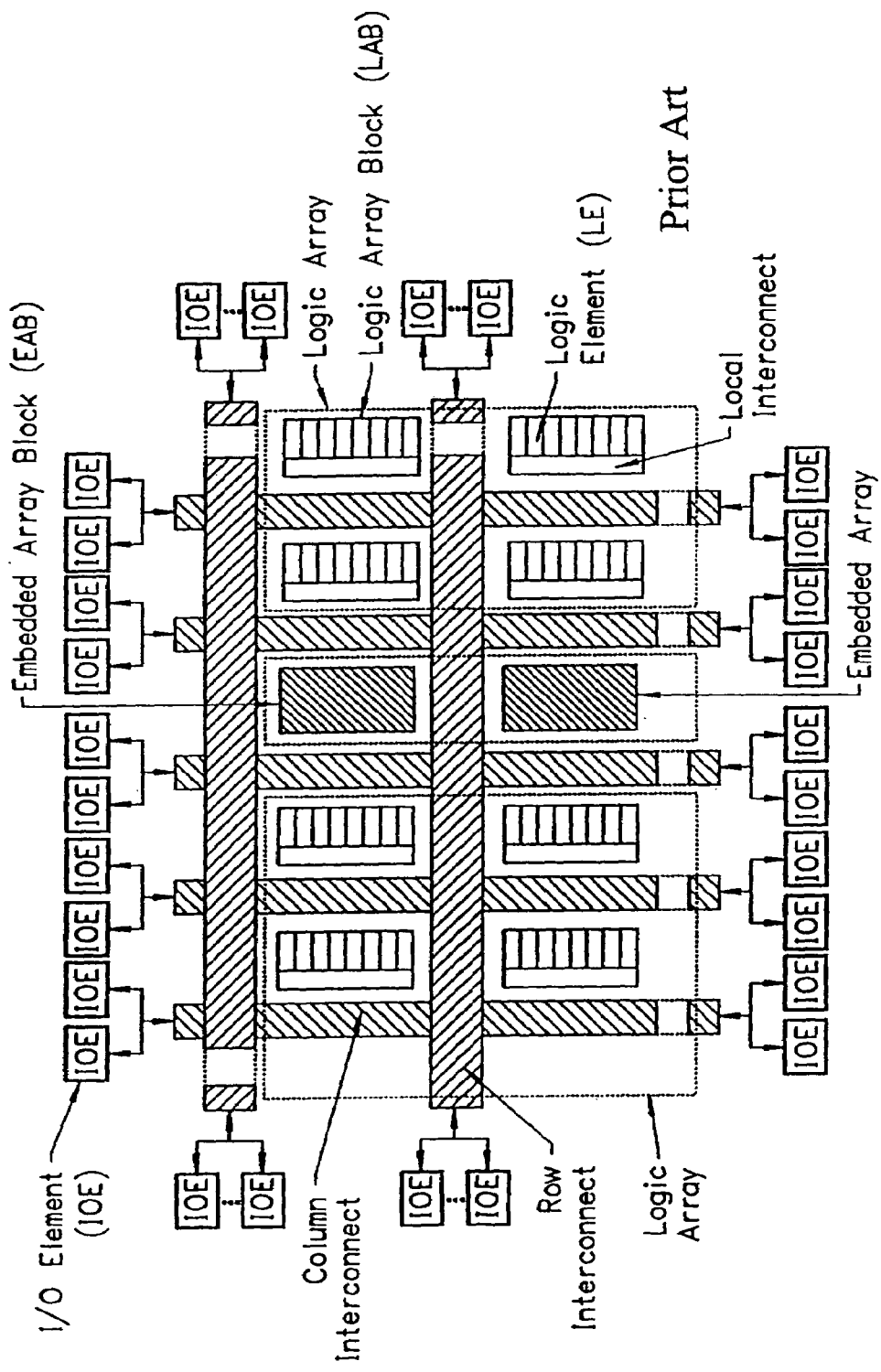
FIG. 4 is a simplified block diagram of a logic array block (LAB).

FIG. 4 shows a programmable logic architecture. The architecture in FIG. 4 further includes embedded array blocks (EABs). EABs contain user memory, a flexible block of RAM. Some or all of the input/output elements may be consistent with embodiments of the present invention. The embedded array blocks can be configured as FIFOs acting as frequency translators and serial to parallel converters for interfacing between high-speed input and outputs and the core circuits including the logic array blocks.

Analog and digital are two types of signals for carrying information. An analog signal is one having a continuous nature rather than a pulsed or discrete nature. An analog signal may vary in frequency, phase, or amplitude in response to changes in physical phenomena, such as sound, light, heat, position, or pressure. A digital signal is one in which discrete steps are used to represent information. In a digital signal, the discrete steps may be further characterized by signal elements, such as significant conditions, significant instants, and transitions.

Circuitry is used to convert electrical signals between the analog and digital domains. One circuit is an analog-to-digital converter (ADC), which converts an analog signal to a digital signal. Another circuit is a digital-to-analog converter (DAC), which converts a digital signal to an analog signal.

Typically, programmable logic integrated circuits are digital integrated circuits because they process digital information, taking input and providing output both in digital form. As programmable logic continues to evolve, there is a need to provide the capability of handling analog information in a programmable logic integrated circuit. The invention provides techniques of implementing digital-to-analog and analog-to-digital converters, so digital data may be input and output in analog form from the programmable logic integrated circuit.

A user may configure the programmable logic to implement a DAC or ADC. Alternatively, the DAC and ADC functionality may be provided by way of an intellectual property (IP) core. Altera refers to these IP cores as megafunctions. Third party vendors and customers may also provide IP cores. Users purchase the IP cores and use them to program their programmable logic with the functionality they purchased. Vendors offer a selection of off-the-shelf megafunctions optimized for programmable logic devices. Designers can easily implement these parameterized blocks of intellectual property, reducing design and test time.

Vendors offer a wide variety of complex system-level IP functions optimized for programmable logic device architecture. These IP cores can help reduce a user's time-to-market, allowing the user to spend time customizing proprietary cores. Several megafunctions may be integrated onto a single PLD for a complete system solution. The following description of DACs and ADCs are implementations that may be hardwired, provided standalone in a programmable logic integrated circuit, or they may be provided as an IP core. A user would purchase the DAC or ADC function and program their device to implement the function. The IP core would configure the logic cells and other programmable logic features of the integrated circuit provide the DAC or ADC function, or both on the same integrated circuit.

Figure 5:
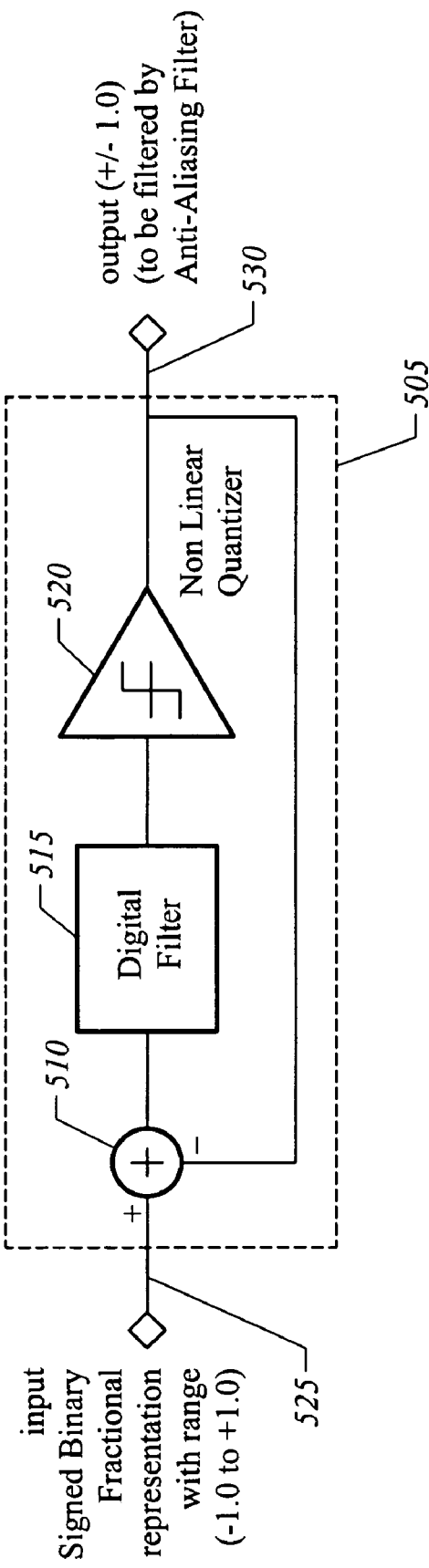
FIG. 5 shows a delta-sigma DAC implementation in a programmable logic integrated circuit.

FIG. 5 shows a delta-sigma DAC implementation in a programmable logic integrated circuit. A box 505 has an adder/subtractor circuit 510 connected to a digital filter circuit 515 connected to a nonlinear quantizer circuit 520. Circuits 510, 515, and 520 are all implemented using logic cells of a programmable logic integrated circuit. In a specific implementation about 500 logic cells of a programmable logic integrated circuit may be used.

The DAC in FIG. 5 is a sigma-delta-based DAC. A sigma-delta-based DAC is inherently linear and only a relatively simple antialiasing filter is needed. The filter is a first, second, or third order filter. A disadvantage of a sigma-delta-based DAC is that relatively many clock cycles are needed to produce a precise analog value.

In operation, digital data bits are input at an input 525. These digital input bits may be in a signed binary fractional representation in a range such as −1.0 to +1.0 and are input to the adder. The adder samples the bits. In one implementation, the digital input bits are sampled at about 1 megabit per second. The output of the nonlinear quantizer is at an output 530. The output will be a sequence of +1 or −1 or corresponding digital values representing +1 or −1. The most significant bit (msb) of the output is connected to an I/O cell of the programmable logic integrated circuit. The output is filtered using an antialiasing filter. The +1 and −1 output will integrate over time to equal the analog value.

Figure 6:
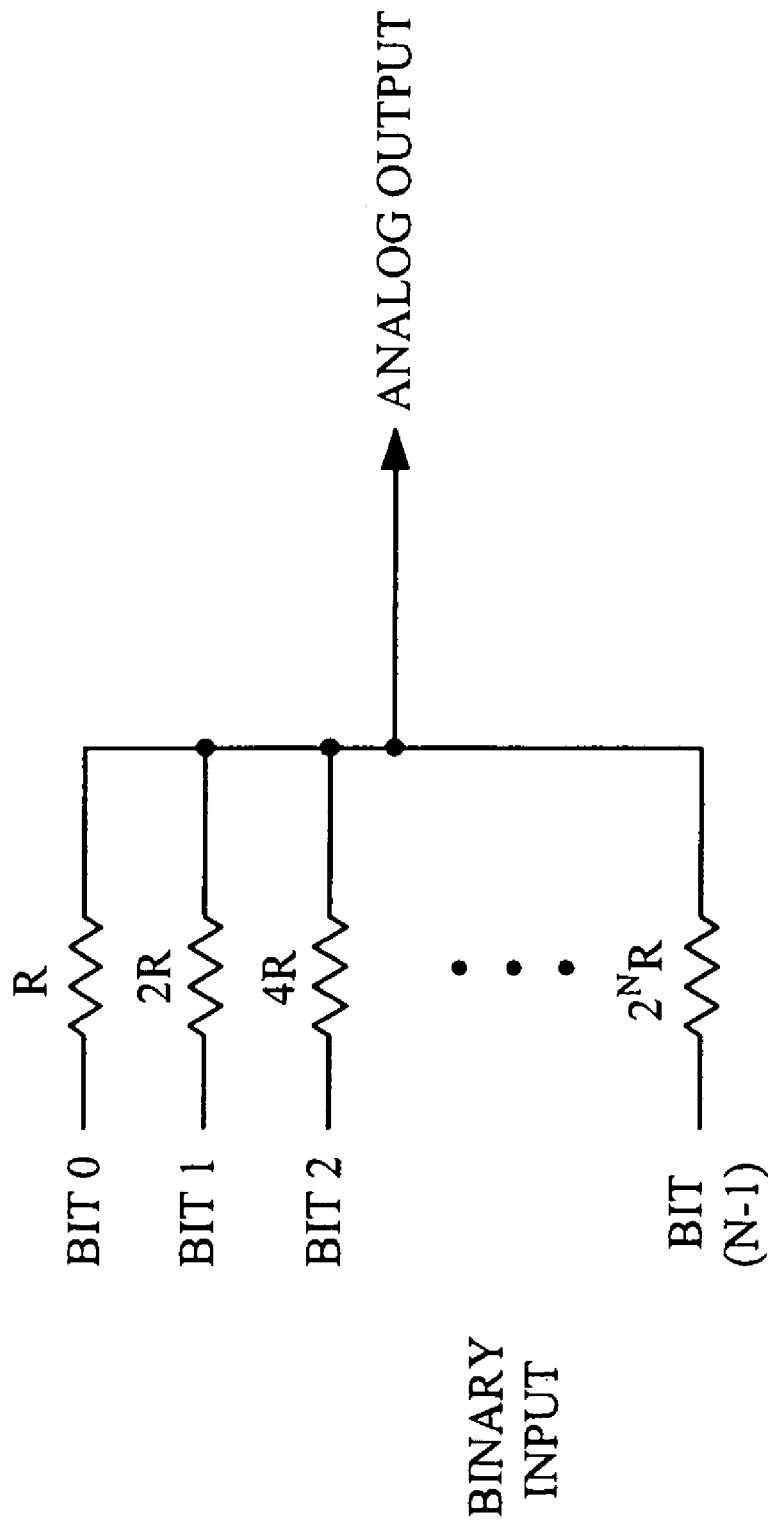
FIG. 6 shows an example of a resistor-ladder DAC circuit in a programmable logic integrated circuit.

FIG. 6 shows an example of a resistor-ladder DAC circuit in a programmable logic integrated circuit. Digital data is input at binary inputs bit 0 to bit (N−1). There will be N resistors, where N−1 is the number of bits. Each resistor is connected between the binary input and an analog output. The resistors may be on-chip or off-chip, or a combination of on-chip and off-chip resistors. The resistors have different values. In this example, the values for each of the resistors are in a sequence given by $(2^N)*R$. So one resistor is R, another resistor is 2R, another resistor is 4R, and so forth. In operation, a digital value, each bit being a 0 or 1, is input at bit 0 to bit (N−1) and a corresponding analog value is output at the analog output.

Benefits of a resistor-ladder DAC include that it is relatively high speed compared to a sigma-delta DAC and also lower cost in implementing, which means may take less circuitry, and thus less integrated circuit area. However, to obtain a higher signal-to-noise ratio, precision resistors may be required.

Figure 7:
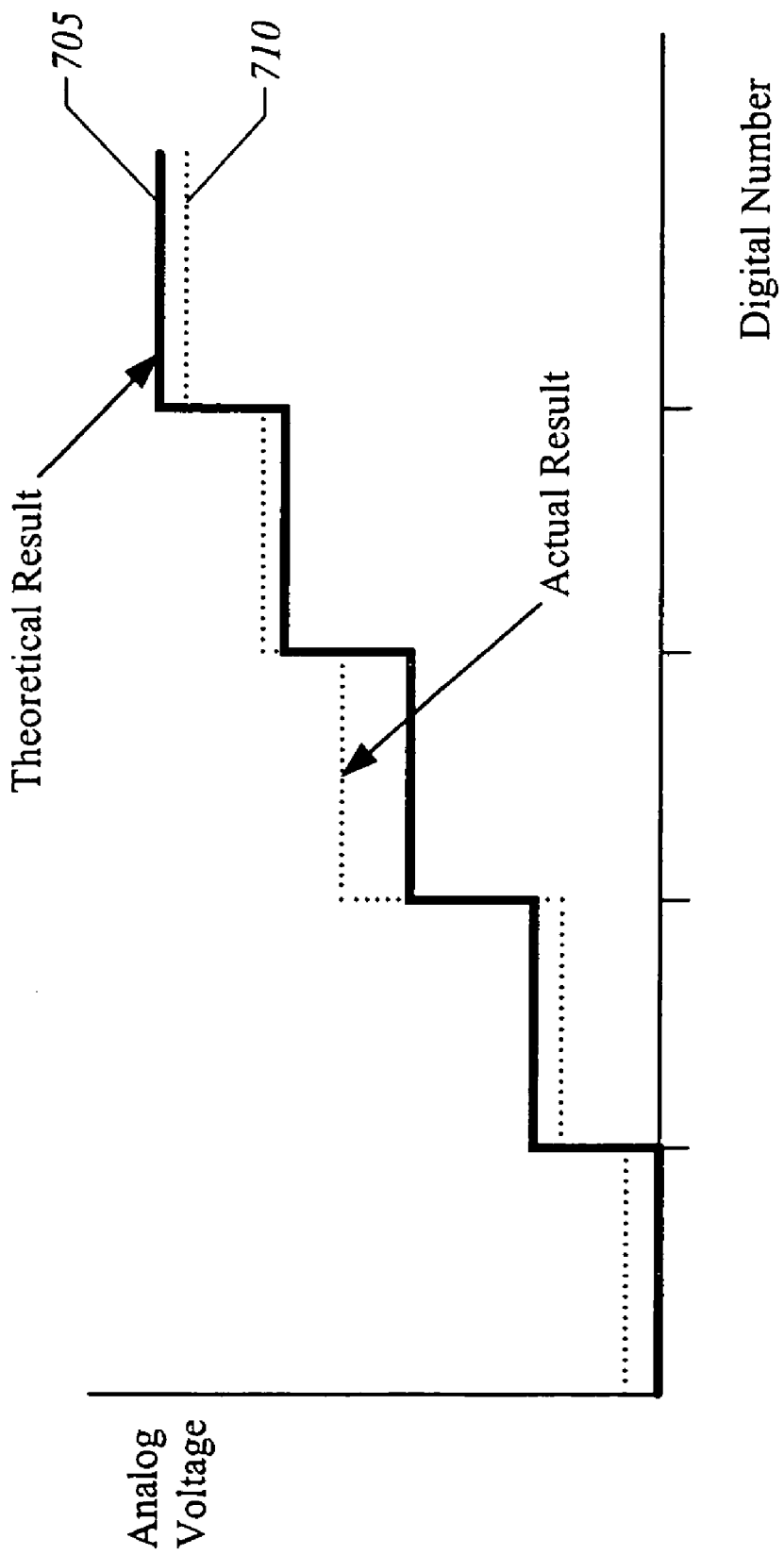
FIG. 7 shows a graph of the operation of a resistor-ladder DAC.

FIG. 7 shows a graph of the operation of a resistor-ladder DAC. For a given digital number (shown in the horizontal or X axis), a corresponding analog voltage is output (shown in the vertical or Y axis). A theoretical result is given by a solid ladder curve 705 while an actual result is given by a broken ladder curve 710.

The theoretical or expected result is the result for the ideal resistor sizes used in the DAC circuit. However, actual resistors have tolerances in their values and are not exactly the value desired. They may be above or below the desired or stated value, and may vary depending on conditions such as temperature. Therefore, with actual resistors, the DAC analog output will follow an actual result curve such as curve 710, where the analog output is above or below the theoretical result. In fact, there may be sometimes significant variations between the actual and expected result. Depending on the application, this may or may not be desirable.

Figure 8:
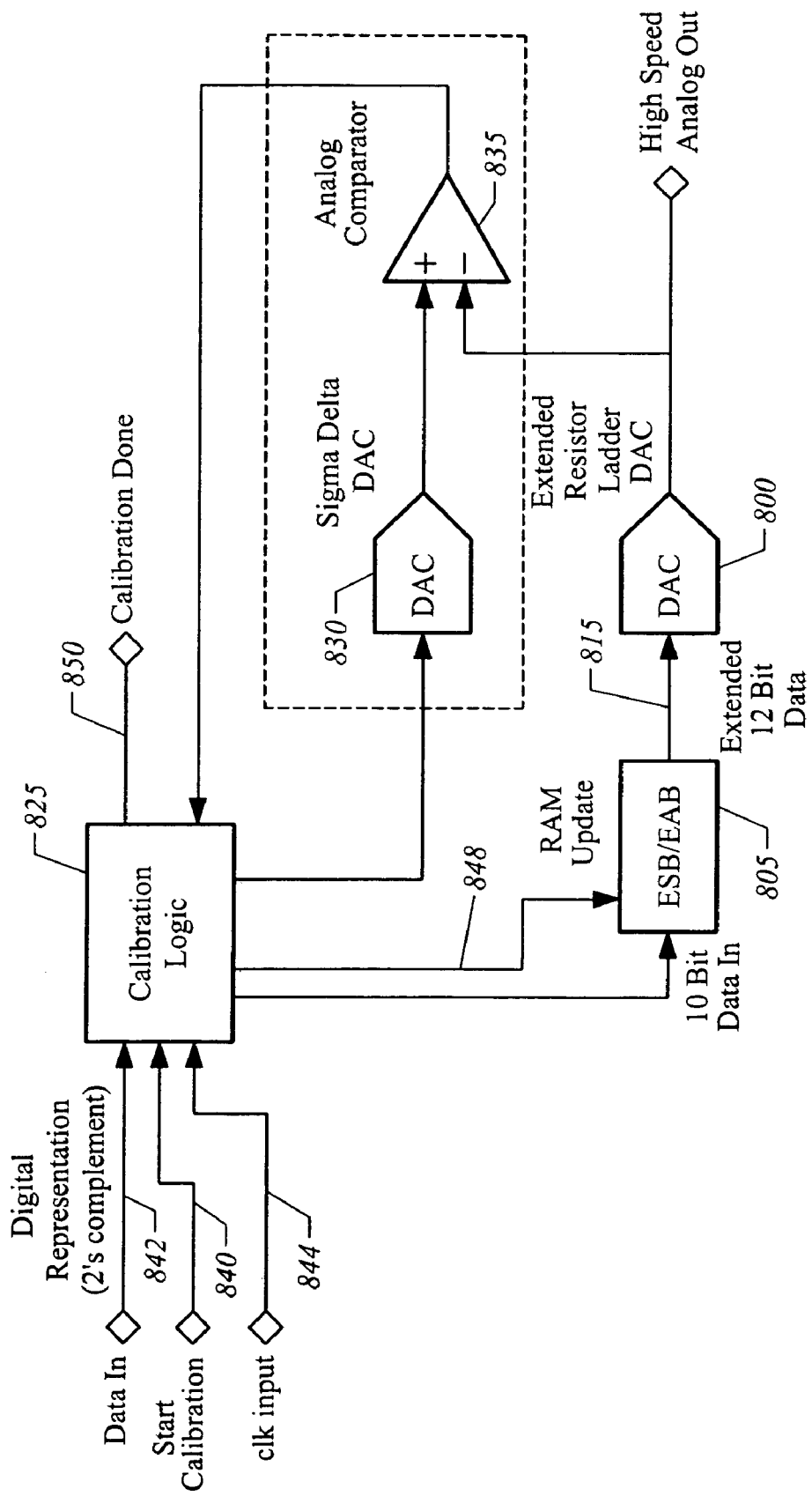
FIG. 8 shows a circuitry to extend the precision of a resistor ladder DAC implemented in a programmable logic integrated circuit.
Figure 9:
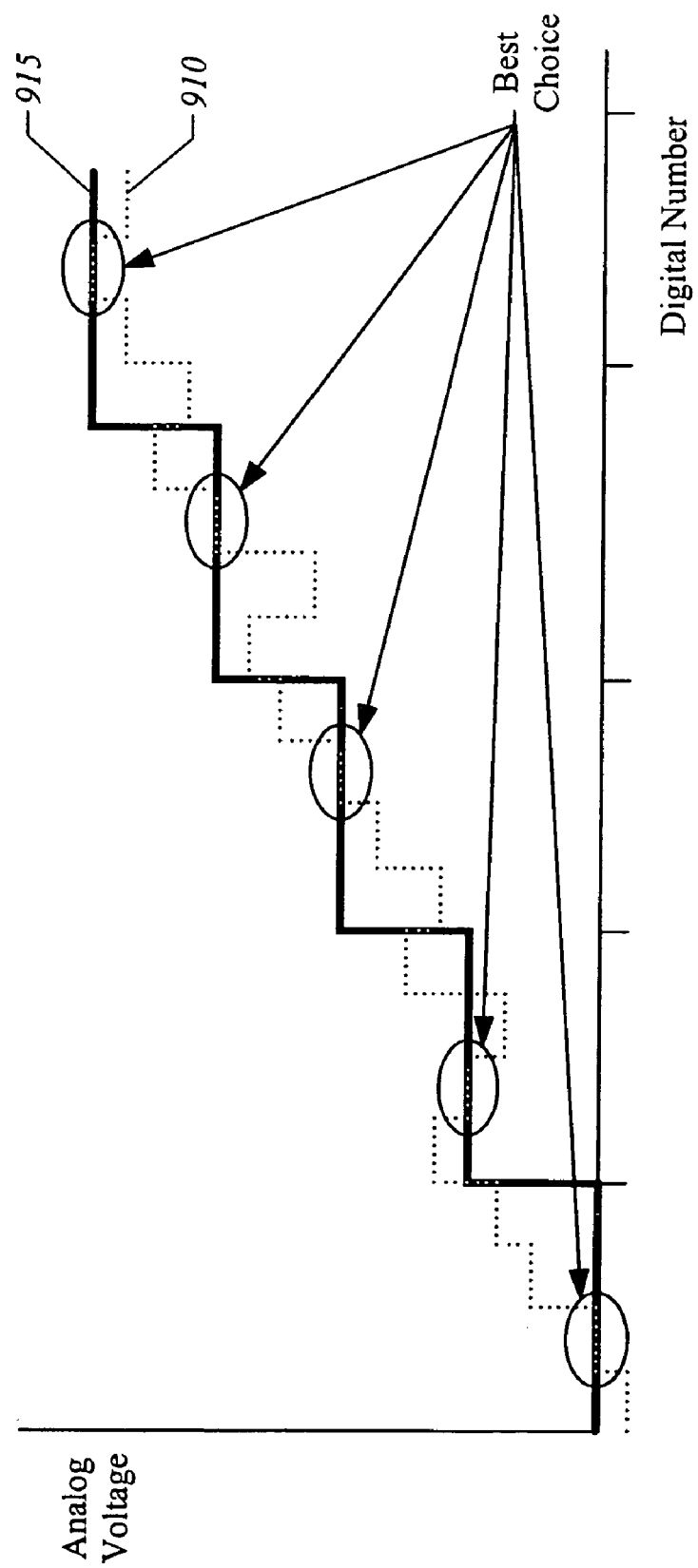
FIG. 9 shows a graph of the operation of a resistor-ladder DAC with extended precision.

FIG. 8 shows a circuitry to extend the precision of a resistor ladder DAC implemented in a programmable logic integrated circuit. FIG. 9 shows a graph of the operation of a resistor-ladder DAC with extended precision. The technique is to extend the number of bits, and then choose the closest value to the theoretical. This decreases the noise level. An enhanced system block (ESB) or EAB may be used to map to the closest analog value.

A higher precision DAC is used than there are bits in the input digital data. For example, the digital input may have 10 bits, but the DAC circuitry will be 12 bits, having more bits than the digital input. The actual result of the 12-bit DAC will resemble a curve 910 (drawn using a broken line) in FIG. 9. A solid line 915 indicates the desired or theoretical analog output for a DAC having the precision of the input digital data (i.e., 10 bits in this example). Because the DAC used has more bits, the actual curve 910 has a greater number of small steps compared to the theoretical curve 915 (which has fewer but larger steps). Circuitry will be used to select and output the step in the actual curve 910 which is closest to the theoretical curve 915. The "best choices" are circled in FIG. 9. As discussed above, an enhanced system block (ESB) or EAB or a programmable logic integrated circuit may be used in the circuitry to map to the closest analog value.

FIG. 8 shows an example of circuitry to extend the precision of a resistor ladder DAC implemented in a programmable logic integrated circuit. FIG. 8 also shows calibration circuitry to calibrate the DAC. The ESB or EAB extends the digital input data to have a greater number of bits and outputs this extended digital input data 815. For example, the ESB or EAB extends 10 bits of input data to 12 bits. The extended data output is input to DAC 800 which outputs a high-speed analog output. In a specific implementation, the resistors for the resistor-ladder DAC are placed off-chip to the programmable logic. However, in some implementations, the resistors may be resident on the same substrate as the programmable logic integrated circuit.

The extended bit version in the example given has 2 bits greater precision than the original data, 12 bits versus 10. This means the extended bit version has four times more precision than the original data. There are four bits of the extended version for every bit of the nonextended version of the input digital data. A two-bit extension is given merely as an example. In specific implementations, the extension may be one bit or more than two bits. For example, there may be 3, 4, 5, 6, 7, 8, 9, 10, 11, 12, 16, 24, or more bits of extension compared to the original input signal. By providing more bits of extension, the resulting analog output may be more precise, having less noise.

For normal operation of the DAC 800, the digital data are input into an ESB or EAB 805. This digital data may have, for example, 10 bits. The ESB or EAB is configured essentially as a look-up table. For a given digital input value, the ESB or EAB will output a previously stored "best value." For example, in FIG. 9, for each step of curve 915, there are four possible digital values in actual curve 910. One of the four possible digital values is closer to the theoretical than the others. This closest value or "best choice" value is stored in the ESB or EAB during a calibration operation. If any one of the four digital values for a given step of the theoretical curve is input to the ESB or EAB, the ESB or EAB outputs the "best choice" value. Then during normal operation, for a given digital input, the ESB or EAB outputs a digital value which will enable the DAC to provide a more precise analog output.

In order to store the "best values" in the ESB or EAB, there is a calibration sequence occur before operating DAC 800. Each programmable logic integrated circuit and resistors have slightly different characteristics. To account for these differences, a calibration sequence will generally before operating DAC 800. The user can choose when to calibrate the extended resistor ladder DAC.

FIG. 8 shows the calibration circuitry, which includes calibration logic 825, another DAC 830, and an analog comparator 835. The calibration circuitry includes the logical circuitry to control the calibration process. This calibration will be implemented on the programmable logic integrated circuit, but may be also part of off-chip circuitry, or partially part of the programmable logic and part external to the programmable logic.

In a specific implementation, DAC 830 is a sigma-delta DAC, which may be similar to the one discussed in FIG. 5. A sigma-delta DAC is desirable because as discussed above, it will provide a generally more precise output than a resistor-ladder DAC. Therefore, for DAC 830, it is desirable to use a sigma-delta DAC with a large oversampling ratio because this will create a very precise voltage value. The filters for the sigma-delta DAC may be off-chip to the programmable logic.

The analog comparator takes inputs from the DAC 800 and DAC 830 outputs to the calibration logic.

In operation, the calibration circuitry is started by a user or other initiation causing event. For example, the calibration may be started by asserting an appropriate signal at a start calibration input 840 to the calibration logic. Then data are input at a data in 842 and a clock signal is input at a clk input 844. The digital data may be represented in two's complement format. The outputs of DAC 800 and 830 are compared using the analog comparator, and the extended bit analog output from DAC 800 one that is closest to DAC 830 precise output will be selected. Calibration continues for each of the ladder steps in the theoretical output. For example, for a 10-bit signal, there would be 1024 steps. And for a 12-bit extended signal, there would be 4096 steps. Of the 4096 values, 1024 "best choice" values will be selected through the calibration process. These values are stored in the RAM of the ESB or EAB using a RAM update line 848. A calibration done signal 850 is used to indicate calibration is completed.

During normal operation, for a 10-bit input, there will be 1024 possible inputs. The ESB or EAB will output a 12-bit output. There will be 1024 possible 12-bit outputs output to DAC 800. Each 10-bit input signal will have four of the same 12-bit outputs in the look-up table of the ESB or EAB. Those four 12-bit outputs for each 10-bit input will be digitally input to DAC 800 so the DAC outputs the "best choice" analog output, closest to the theoretical output. By using the extended resistor ladder DAC technique and circuitry of the invention, a higher precision resistor-ladder DAC is implemented, especially for programmable logic.

Figure 10:
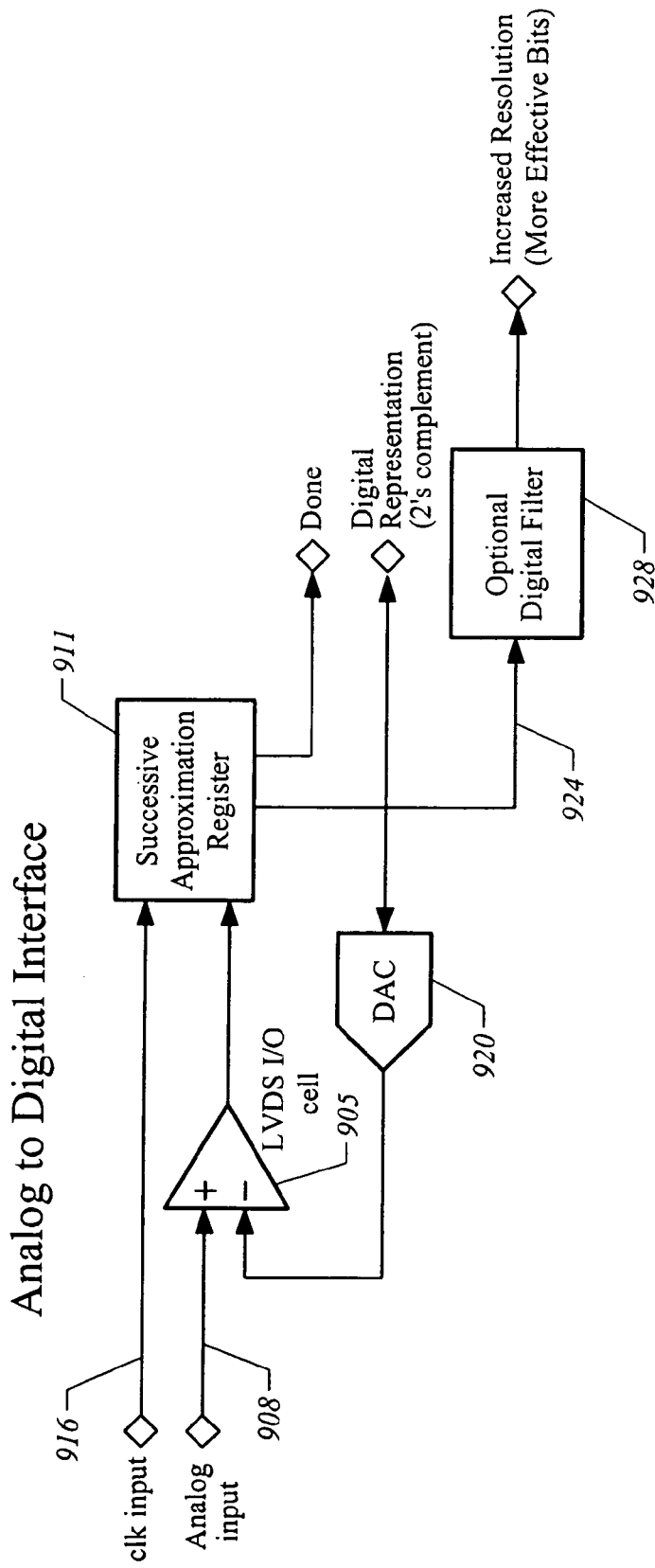
FIG. 10 shows an implementation of a analog-to-digital converter (ADC) using a successive approximation circuit.

An analog-to-digital converter (ADC) may be implemented in a programmable logic integrated circuit. FIG. 10 shows an example of one implementation of an ADC in a programmable logic integrated circuit. The FIG. 10 implementation is a successive-approximation-based ADC, which provides relatively high-speed operation. A successive-approximation-based ADC uses a DAC to create a reference for comparison. A sigma-delta-based DAC or calibrated-resistor-ladder DAC as described above may be used, or other types of DACs may be used.

The circuitry includes an low-voltage differential signal (LVDS) I/O cell of the programmable logic. An LVDS I/O cell is one that supports the LVDS standard. Alternatively, a standard I/O cell may be used. An analog signal input 908 is input to the LVDS I/O cell. Output from the LVDS I/O cell is input to a successive approximation register 911, which is logical circuitry to perform a binary search.

The successive approximation register is implemented using logic cells of the programmable logic. There is also a clock input 916 to the successive approximation register. There is a DAC 920 to provide a reference. Input to DAC 920 is a digital representation, which may be in two's complement format. The DAC, for example, may be a sigma-delta or resistor-ladder DAC implemented using logic cells as described above. For a resistor-ladder DAC, the resistors may be off-chip to the programmable logic.

The analog output of DAC 920 is input to the LVDS I/O cell. In this configuration, the LVDS I/O cell acts like a comparator. Based on output from the LVDS I/O, the successive approximation register searches and converges to a digital value that is equivalent to the analog input and outputs this on an output line 924. Optionally, output line 924 may be input into a digital filter 928, which will provide an digital filter output that is the digital output with increased resolution, having more effective bits of resolution.

Figure 11:
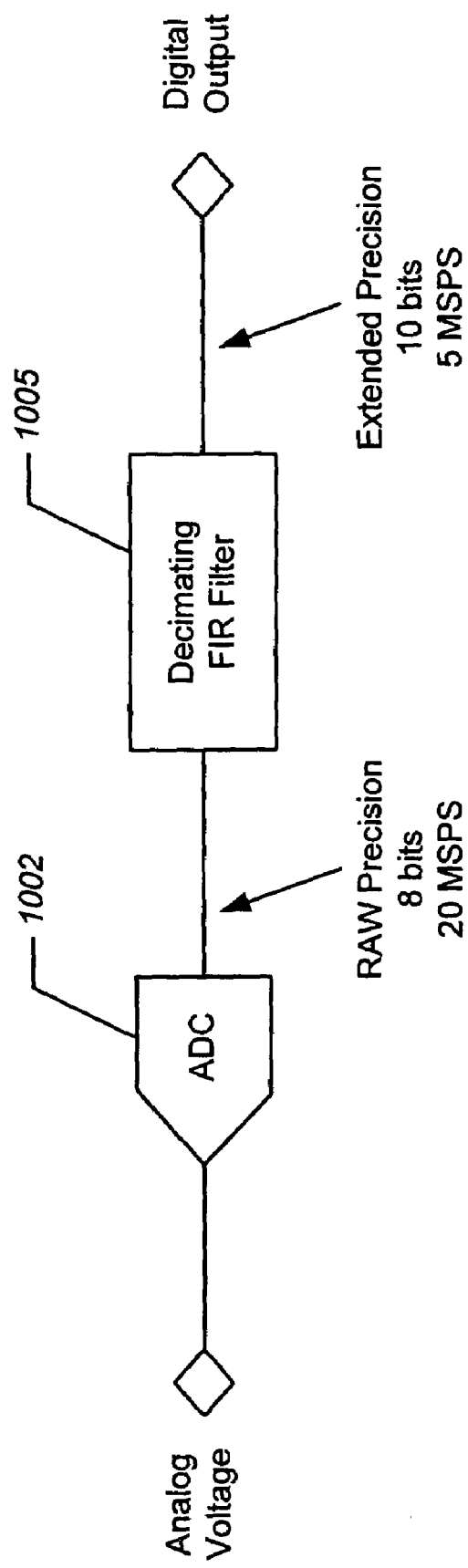
FIG. 11 shows another implementation of a analog-to-digital converter for a programmable logic integrated circuit.

FIG. 11 shows another implementation of a digital-to-analog converter for a programmable logic integrated circuit. This implementation uses oversampling and filtering to increase an ADC's (1002) raw precision. A decimating FIR filter 1005 is placed at an output of the ADC. For example, the raw precision of the ADC may have 8 bits of resolution and 20 megasamples per second. This is input to the decimating FIR filter, which provides an extended precision output. For example, the extended precision output may have 10 bits of resolution at 5 megasamples per second.

This description of the invention has been presented for the purposes of illustration and description. It is not intended to be exhaustive or to limit the invention to the precise form described, and many modifications and variations are possible in light of the teaching above. The embodiments were chosen and described in order to best explain the principles of the invention and its practical applications. This description will enable others skilled in the art to best utilize and practice the invention in various embodiments and with various modifications as are suited to a particular use. The scope of the invention is defined by the following claims.

What is claimed is:

1. An integrated circuit comprising:
   an analog-to-digital converter comprising:
      a digital-to-analog converter;
      a comparator having a first input coupled to an output of the digital-to-analog converter and a second input coupled to receive an analog input voltage;
      a successive approximation register having an input coupled to an output of the comparator; and
      a memory having an input coupled to an output of the successive approximation register and an output coupled to an input of the digital-to-analog converter, wherein the output of the digital-to-analog converter is coupled to the first input of the comparator.

2. The integrated circuit of claim 1 wherein the memory is configured to receive N bits of data and provide M bits of data, where M is greater than N.

3. The integrated circuit of claim 2 wherein the memory is a look-up table.

4. The integrated circuit of claim 2 wherein the digital-to-analog converter is resistor-ladder based.

5. The integrated circuit of claim 2 wherein N is 10 and M is 12.

6. The integrated circuit of claim 2 wherein at least some of the analog-to-digital converter is formed by configuring a plurality of programmable logic elements.

7. The integrated circuit of claim 2 wherein the integrated circuit is a field programmable gate array.

8. The integrated circuit of claim 1, wherein the comparator is an LVDS I/O cell.

9. A method of converting analog signals to digital signals comprising:
   performing a calibration by:
      converting a first digital signal to a first analog signal;
      converting a second digital signal to a second analog signal;
      comparing the first analog signal to the second analog signal; and
      storing a digital entry, the digital entry based on the comparing the first analog signal to the second analog signal; then
   converting a third analog signal to a third digital signal by:
      using the digital entry to generate a fourth digital signal;
      converting the fourth digital signal to a fourth analog signal;
      comparing the fourth analog signal to the third analog signal; and
      producing the third digital signal based on the comparison of the fourth analog signal to the third analog signal.

10. The method of claim 9 wherein the entry is addressed using N bits and the fourth digital signal comprises M bits.

11. The method of claim 10 wherein N is 10 and M is 12.

12. The method of claim 10 wherein the first digital signal is converted to a first analog signal using a sigma-delta converter.

13. The method of claim 10 wherein the first digital signal is converted to the first analog signal using a sigma-delta converter and the second digital signal is converted to the second analog signal using a resistor-ladder based converter.

14. The method of claim 10 wherein the first digital signal is converted to the first analog signal at a lower rate than the second digital signal is converted to the second analog signal.

15. An integrated circuit comprising:
   an analog-to-digital converter comprising:
      a memory;
      a first digital-to-analog converter having an input coupled to the memory;
      a first comparator having a first input coupled to an output of the first digital-to-analog converter and a second input coupled to receive an analog input voltage; and
      a successive approximation register having an input coupled to an output of the first comparator and an output coupled to an input of the memory; and
   a calibration loop comprising:
      a second digital-to-analog converter;
      a second comparator having a first input coupled to an output of the second digital-to-analog converter and a second input coupled to the output of the first digital-to-analog converter; and
      a calibration logic circuit having an input coupled to an output of the second comparator and coupled to write data to the memory.

16. The integrated circuit of claim 15 wherein the memory is configured to receive an N bit input and provide an M bit output to the first digital-to-analog converter, wherein M is greater than N.

17. The integrated circuit of claim 16 wherein the memory is configured as a look-up table.

18. The integrated circuit of claim 17 wherein N is 10 and M is 12.

19. The integrated circuit of claim 16 wherein at least some of the analog-to-digital converter is formed by configuring a plurality of programmable logic elements.

20. The integrated circuit of claim 16 wherein at least some of the calibration loop is formed by configuring a plurality of programmable logic elements.

21. The integrated circuit of claim 16 wherein the integrated circuit is a field programmable gate array.

\* \* \* \* \*